United States Patent
Kim (10) Patent No.: US 12,394,478 B2
(45) Date of Patent: Aug. 19, 2025

(54) MEMORY AND OPERATION METHOD THEREOF

(71) Applicant: SK hynix Inc., Icheon (KR)

(72) Inventor: Kyu Sung Kim, Icheon (KR)

(73) Assignee: SK hynix Inc., Icheon (KR)

( * ) Notice: Subject to any disclaimer, the term of this patent is extended or adjusted under 35 U.S.C. 154(b) by 168 days.

(21) Appl. No.: 18/463,720

(22) Filed: Sep. 8, 2023

(65) Prior Publication Data

US 2024/0386953 A1 Nov. 21, 2024

(30) Foreign Application Priority Data

May 16, 2023 (KR) .................. 10-2023-0062798

(51) Int. Cl.
*G11C 13/04* (2006.01)
*G11C 7/08* (2006.01)
*G11C 13/00* (2006.01)

(52) U.S. Cl.
CPC ............. *G11C 13/004* (2013.01); *G11C 7/08* (2013.01); *G11C 13/0026* (2013.01); *G11C 13/0028* (2013.01); *G11C 13/0061* (2013.01)

(58) Field of Classification Search
CPC ..... G11C 13/004; G11C 7/08; G11C 13/0026; G11C 13/0028; G11C 13/0061; G11C 16/0483; G11C 16/26; G11C 16/32; G11C 13/0038; G11C 13/0069
See application file for complete search history.

(56) References Cited

U.S. PATENT DOCUMENTS

| 11,145,366 | B1 | 10/2021 | Mantegazza et al. |
| 2009/0303785 | A1* | 12/2009 | Hwang ............ G11C 13/0004 365/207 |

FOREIGN PATENT DOCUMENTS

KR 1020090126587 A 12/2009

* cited by examiner

*Primary Examiner* — Xiaochun L Chen (57) ABSTRACT

A memory may include: a cell array including a plurality of memory cells; a line control circuit configured to apply a read voltage to a selected memory cell among the plurality of memory cells; and a sense amplifier configured to determine data of the selected memory cell, wherein a length of an interval between a time point when the read voltage is applied to the selected memory cell and a time point when the sense amplifier is activated is adjusted according to an elapsed time since a write operation is performed on the selected memory cell.

15 Claims, 6 Drawing Sheets

MEMORY AND OPERATION METHOD THEREOF

CROSS-REFERENCE TO RELATED APPLICATION

This application claims priority under 35 U.S.C. § 119 to Korean Patent Application No. 10-2023-0062798 filed on May 16, 2023, which is incorporated herein by reference in its entirety.

BACKGROUND

1. Technical Field

Embodiments of the present disclosure relate to an electronic device, and more particularly, to a memory and an operation method thereof.

2. Related Art

Recently, research on next-generation memories for replacing a DRAM and a flash memory has been actively conducted. One of such next-generation memories is a resistive memory using a material capable of switching between at least two different resistance states due to a rapid change in resistance depending on an applied bias, that is, using a variable resistance material, and representative examples thereof may include a phase change random access memory (PRAM), a resistive random access memory (RRAM), a magnetic random access memory (MRAM), and a ferroelectric random access memory (FRAM).

The next-generation memories are able to operate at a high speed while having non-volatile characteristics. Particularly, the PRAM may include a memory cell made of chalcogenide and store data by changing a resistance value of the memory cell.

SUMMARY

In an embodiment, a memory may include: a cell array including a plurality of memory cells; a line control circuit configured to apply a read voltage to a selected memory cell among the plurality of memory cells; and a sense amplifier configured to determine data of the selected memory cell, wherein a length of an interval between a time point when the read voltage is applied to the selected memory cell and a time point when the sense amplifier is activated is adjusted according to an elapsed time since a write operation is performed on the selected memory cell.

In an embodiment, an operation method of a memory may include: applying a read voltage to a memory cell; and determining data of the memory cell by enabling a sense amplifier after a specific interval has elapsed from a time point of applying the read voltage, wherein a length of the specific interval is adjusted according to an elapsed time since a write operation is performed on the memory cell.

DETAILED DESCRIPTION

Various embodiments are directed to a memory capable of stably reading data even though a threshold voltage of a memory cell changes due to a drift.

Hereafter, embodiments in accordance with the technical spirit of the present disclosure will be described with reference to the accompanying drawings.

Figure 1:
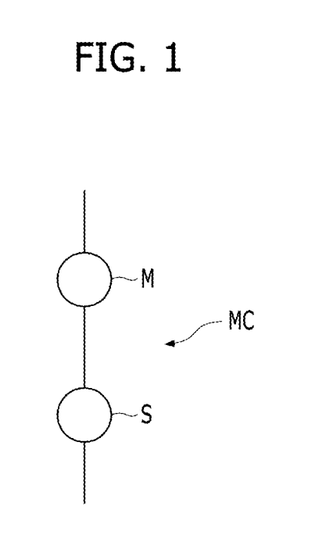
FIG. 1 illustrates a memory cell of a memory.
Figure 2:
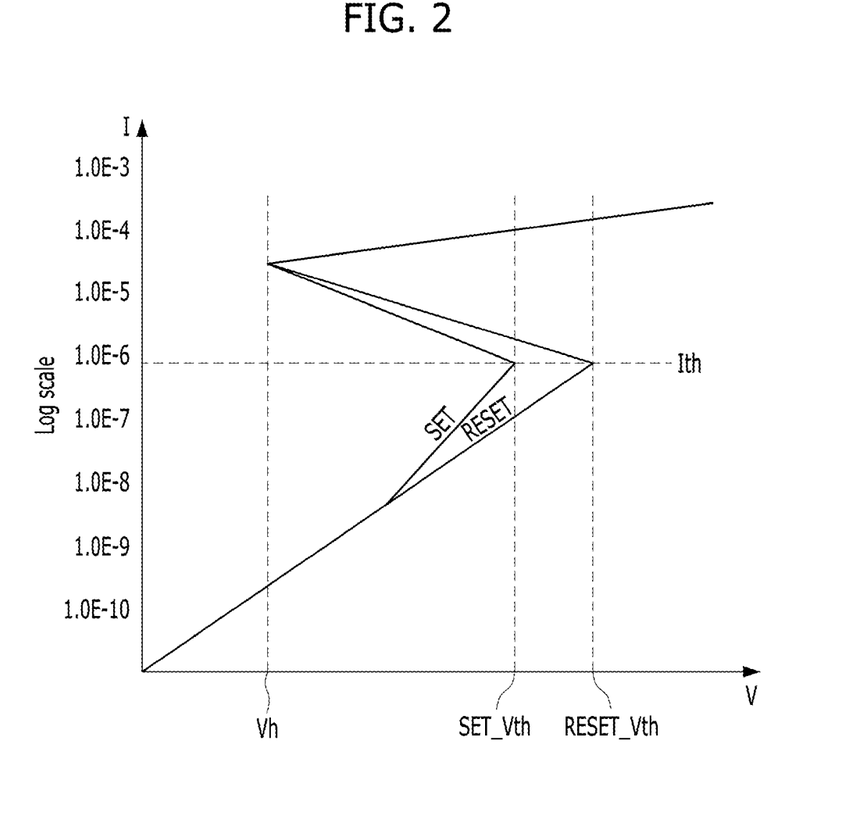
FIG. 2 illustrates an I-V curve of the memory cell.

FIG. 1 illustrates a memory cell MC of a memory, and FIG. 2 illustrates an I-V curve of the memory cell MC.

Referring to FIG. 1, the memory cell MC may include a storage element M and a switching element S.

The storage element M is for storing data, and may include a variable resistance material. The storage element M may include a resistance change layer, a phase change layer, a magnetic tunneling junction layer, or the like. The storage element M may have a low resistance state or a high resistance state according to stored data. For example, the storage element M may have a low resistance value in a crystalline state and a high resistance value in an amorphous state. Hereinafter, the low resistance state is referred to as a SET state, and the high resistance state is referred to as a RESET state.

The switching element S is for selecting the memory cell MC, and may include a switching material. The switching element S may be an MIT element, an MIEC element, an ovonic threshold switch (OTS) element, or the like. When the switching element S includes the OTS element, the switching element S allows a very small amount of current to flow therethrough when turned off, and is turned on when an amount of current applied thereto exceeds a threshold value Ith. When the switching element S is turned on, a snapback phenomenon may occur, wherein the current flowing through the memory cell MC rapidly increases, resulting in a rapid decrease in a voltage level across the memory cell MC.

The shape and configuration of the memory cell MC may be variously modified. For example, the switching element S may be omitted or the positions of the switching element S and the storage element M may be exchanged.

FIG. 2 illustrates a current flowing through the memory cell MC according to a voltage applied across the memory cell MC. Referring to FIG. 2, as a level of the voltage applied across the memory cell MC increases, an amount of current flowing through the memory cell MC increases. At the same voltage level, the amount of current flowing through the memory cell MC in the SET state may be greater than the amount of current flowing through the memory cell MC in the RESET state.

When the voltage across the memory cell MC in the SET state reaches a threshold voltage SET_Vth, the amount of current flowing through the memory cell MC reaches a threshold value Ith, and the switching element S of the memory cell MC is turned on. Accordingly, the snapback phenomenon may occur, and thus a voltage level across the memory cell MC rapidly decreases and the amount of current flowing through the memory cell MC rapidly increases. After that, when the voltage across the memory cell MC reaches a hold voltage Vh, the memory cell MC is turned off again.

When the voltage across the memory cell MC in the RESET state reaches a threshold voltage RESET_Vth, the amount of current flowing through the memory cell MC reaches the threshold value Ith, and the switching element S of the memory cell MC is turned on. Accordingly, the snapback phenomenon may occur, and thus the voltage level across the memory cell MC rapidly decreases and the amount of current flowing through the memory cell MC rapidly increases. When the voltage across the memory cell MC reaches the hold voltage Vh, the memory cell MC is turned off again.

Figure 3:
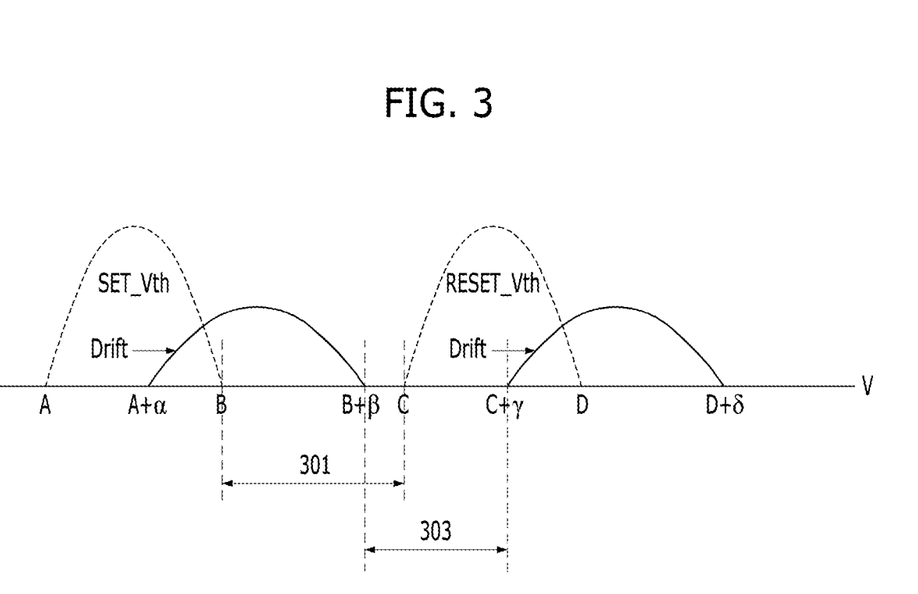
FIG. 3 illustrates distributions of threshold voltages in a low resistance state and threshold voltages in a high resistance state of memory cells in a cell array.

FIG. 3 illustrates distributions of threshold voltages SET_Vth in a low resistance state and threshold voltages RESET_Vth in a high resistance state of memory cells MC.

The memory cell MC shown in FIG. 1 may be included in a cell array including a plurality of rows and a plurality of columns, and the cell array may include a total number of memory cells equal to the product of the number of rows and the number of columns. The memory cells in the cell array exhibit different threshold voltages for SET_Vth and RESET_Vth. These threshold voltages vary based on various factors, including process variables and noise associated with the memory cells. In FIG. 3, a horizontal axis may represent a voltage V, and a vertical axis may represent the number of memory cells having a corresponding threshold voltage.

In FIG. 3, a dotted line represents distributions of threshold voltages of memory cells included in the cell array immediately after data is written to the memory cells. The threshold voltages SET_Vth of the memory cells in a low resistance state show a distribution in a range of A to B, and the threshold voltages RESET_Vth of the memory cells in a high resistance state show a distribution in a range of C to D. Since the number of memory cells included in the cell array increases as the size of the cell array increases, the distribution of threshold voltages also widens. As the distribution of the threshold voltages widens, a usable range of a read voltage VREAD is reduced. That is, a read margin is reduced.

The read voltage VREAD needs to be greater than the highest value B among the threshold voltages SET_Vth in the low-resistance state and needs to be lower than the lowest value C among the threshold voltages RESET_Vth in the high resistance state. That is, when considering the distributions of the threshold voltages SET_Vth and RESET_Vth, the usable range of the read voltage VREAD may be a range 301 of B to C.

In the memory cell MC including the storage element M and the switching element S, a drift phenomenon in which a threshold voltage changes over time may occur. In FIG. 3, a solid line represents distributions of the threshold voltages SET_Vth and RESET_Vth of the memory cells in the cell array after the drift phenomenon occurs. Referring to the solid line in FIG. 3, the threshold voltages SET_Vth of the memory cells in the low resistance state may show a distribution in a range of A+α to B+β, and the threshold voltages RESET_Vth of the memory cells in the high resistance state may show a distribution in a range of C+γ to D+δ. When considering the drift phenomenon, the usable range of the read voltage VREAD may be a range 303 of B+β to C+γ.

Figure 4:
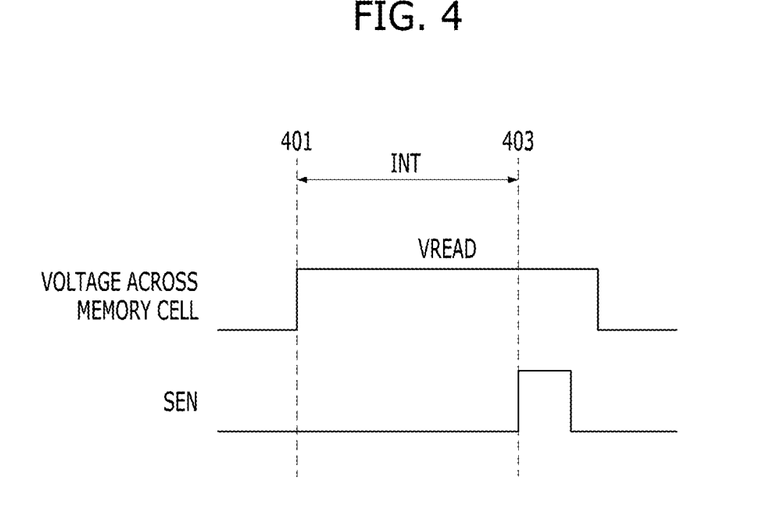
FIG. 4 describes a read operation of the memory cell.

FIG. 4 describes a read operation of the memory cell MC.

Referring to FIG. 4, the read voltage VREAD may be applied across the memory cell MC at a time point 401. The read voltage VREAD may have a higher level than the threshold voltage SET_Vth in the low resistance state and a lower level than the threshold voltage RESET_Vth in the high resistance state. When the read voltage VREAD is applied across the memory cell MC, if the storage element M of the memory cell MC is in the low resistance state, the memory cell MC is turned on, that is, a snapback phenomenon in which the switching element S is turned on occurs, so that a large amount of current may flow through the memory cell MC. On the other hand, if the storage element M of the memory cell MC is in the high resistance state, the memory cell MC is not turned on, that is, the snapback phenomenon in which the switching element S is turned on does not occur, so that a very small amount of current may flow through the memory cell MC.

When a sensing enable signal SEN for enabling a sensing operation is enabled at a time point 403 in a state in which the read voltage VREAD is applied across the memory cell MC, data stored in the memory cell MC may be sensed. The sensing operation may be performed by sensing an amount of current flowing through the memory cell MC while the read voltage VREAD is applied across the memory cell MC. For example, the sensing operation may be performed by sensing a voltage level of a word line or a bit line that changes according to the amount of current flowing through the memory cell MC.

The threshold voltages SET_Vth and RESET_Vth of the memory cell MC may be changed according to the length of a time difference between the time point 401 and the time point 403, i.e., an interval INT between the time point 401 and the time point 403. In general, as the interval INT increases, the threshold voltages SET_Vth and RESET_Vth of the memory cell MC may decrease. On the other hand, as the interval INT decreases, the threshold voltages SET_Vth and RESET_Vth of the memory cell MC may increase.

Figure 5:
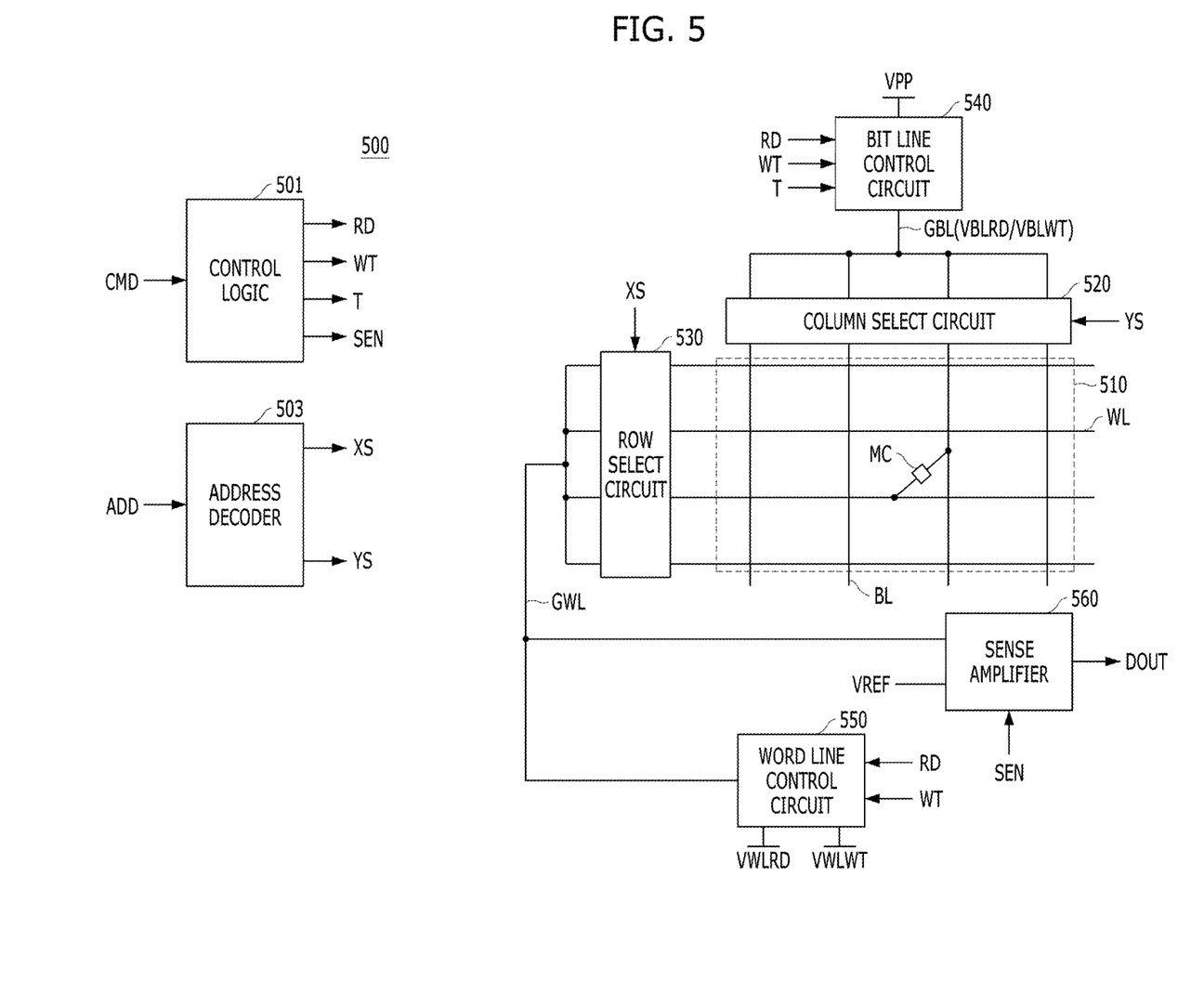
FIG. 5 illustrates a memory in accordance with an embodiment.

FIG. 5 illustrates a memory 500 in accordance with an embodiment.

Referring to FIG. 5, the memory 500 may include a control logic 501, an address decoder 503, a cell array 510, a column select circuit 520, a row select circuit 530, and a bit line control circuit 540, a word line control circuit 550, and a sense amplifier 560.

The control logic 501 may decode a command CMD transmitted from a memory controller (not shown) and generate a read signal RD, a write signal WT, elapsed time information T, and a sensing enable signal SEN. The read signal RD may be enabled when a read operation is instructed by the command CMD, and the write signal WT may be enabled when a write operation is instructed by the command CMD. The sensing enable signal SEN may be a signal for enabling the sense amplifier 560.

The elapsed time information T may indicate a time that has passed since data is written into a memory cell, specifically a memory cell selected by an address ADD when performing the read operation. The memory controller may manage time information relating to a write operation instructed by the memory controller for each address ADD. When instructing a read operation for a specific address ADD, the memory controller may transmit, to the memory 500, time information indicating how much time has passed from a previous write operation for the specific address ADD. In an embodiment, this time information may be transmitted from the memory controller to the memory 500 in the form of a command CMD or an address ADD. In another embodiment, the time information may be transmitted from the memory controller to the memory 500 separately from the command CMD and/or the address ADD.

The present embodiment describes an example in which this time information is transmitted from the memory controller to the memory 500 in the form of a command CMD. The control logic 501 decodes the command CMD and generates the elapsed time information T. The control logic

501 may adjust a time from an activation time point of the read signal RD to an activation time point of the sensing enable signal SEN, that is, the length of the interval INT in FIG. 4, according to the elapsed time information T.

The address decoder 503 may decode the address ADD transmitted from the memory controller and generate a row select signal XS and a column select signal YS. The address decoder 503 may decode a row address included in the address ADD and generate the row select signal XS, and may decode a column address included in the address ADD and generate the column select signal YS.

The cell array 510 may have a hierarchical connection structure. A plurality of word lines WL and a plurality of bit lines BL may be disposed in the cell array 510. Memory cells MC may be provided at intersections of the word lines WL and the bit lines BL, respectively.

The memory 500 may include a line control circuit for accessing the memory cells MC of the cell array 510. The line control circuit may include the bit line control circuit 540, the column select circuit 520, the word line control circuit 550, and the row select circuit 530.

The bit line control circuit 540 may be connected to a global bit line GBL. The bit line control circuit 540 may change a voltage level of the global bit line GBL for read and write operations. The bit line control circuit 540 may provide at least one voltage to the global bit line GBL in response to the read signal RD and the write signal WT. The bit line control circuit 540 may receive a power supply voltage VPP and provide a first read boundary voltage VBLRD to the global bit line GBL in response to the read signal RD. The first read boundary voltage VBLRD may have a lower voltage level than the power supply voltage VPP. The bit line control circuit 540 may apply a first write boundary voltage VBLWT to the global bit line GBL in response to the write signal WT. The first write boundary voltage VBLWT may have a voltage level that is equal to or lower than a voltage level of the power supply voltage VPP and higher than a voltage level of the first read boundary voltage VBLRD.

As will be described below, the voltage level of the first read boundary voltage VBLRD may be set so that the read voltage VREAD may be applied across the memory cell MC, and the voltage level of the first write boundary voltage VBLWT may be set so that a write voltage may be applied across the memory cell MC.

The read voltage VREAD may have an appropriate voltage level capable of determining a resistance state of the memory cell MC. For example, the read voltage VREAD may have a voltage level higher than a maximum threshold voltage of a distribution of threshold voltages of memory cells in a low resistance state and have a voltage level lower than a minimum threshold voltage of a distribution of threshold voltages of memory cells in a high resistance state.

The bit line control circuit 540 may adjust the level of the first read boundary voltage VBLRD according to the elapsed time information T so that the level of the read voltage VREAD may be adjusted according to the elapsed time information T. The level of the read voltage VREAD corresponds to a voltage difference between the first read boundary voltage VBLRD and a second read boundary voltage VWLRD. Accordingly, when the bit line control circuit 540 adjusts the level of the first read boundary voltage VBLRD according to the elapsed time information T, the level of the read voltage VREAD may be adjusted according to the elapsed time information T.

The column select circuit 520 may electrically connect a bit line selected by the column select signal YS, among the plurality of bit lines BL of the cell array 510, to the global bit line GBL.

The word line control circuit 550 may be connected to a global word line GWL. The word line control circuit 550 may change a voltage level of the global word line GWL for read and write operations. The word line control circuit 550 may provide at least one voltage to the global word line GWL in response to the read signal RD and the write signal WT. The word line control circuit 550 may change a current flowing through the memory cell MC by changing a current flowing through the global word line GWL in response to the read signal RD or the write signal WT. The word line control circuit 550 may receive the second read boundary voltage VWLRD and apply the second read boundary voltage VWLRD to the global word line GWL in response to the read signal RD. The second read boundary voltage VWLRD may have a lower voltage level than the first read boundary voltage VBLRD. For example, the second read boundary voltage VWLRD may be a negative voltage having a voltage level that is equal to or less than a ground voltage. The voltage level of the second read boundary voltage VWLRD may be set so that the voltage difference between the first read boundary voltage VBLRD and the second read boundary voltage VWLRD corresponds to the level of the read voltage VREAD. The word line control circuit 550 may allow a clamping current to flow through the global word line GWL in response to the read signal RD. The clamping current may have a minimum amount of current that changes the voltage level of the global word line GWL according to the resistance state of the memory cell MC when the memory cell MC is turned on.

The word line control circuit 550 may receive a second write boundary voltage VWLWT, and apply the second write boundary voltage VWLWT to the global word line GWL in response to the write signal WT. The second write boundary voltage VWLWT may have a voltage level equal to or lower than the second read boundary voltage VWLRD. The voltage level of the second write boundary voltage VWLWT may be set so that a voltage difference between the first write boundary voltage VBLWT and the second write boundary voltage VWLWT corresponds to a level of a write voltage. The word line control circuit 550 may allow various currents to flow through the global word line GBL in response to the write signal WT.

For example, when set data is written in the memory cell MC, the word line control circuit 550 may allow a set current for programming the memory cell MC to a low resistance state to flow through the global word line GWL. When reset data is written in the memory cell MC, the word line control circuit 550 may allow a reset current for programming the memory cell MC to a high resistance state to flow through the global word line GWL. The set current may be smaller than the reset current. A time period during which the set current flows in order to program the memory cell MC to the low resistance state may be longer than a time period during which the reset current flows to program the memory cell MC to the high resistance state.

The row select circuit 530 may electrically connect a word line selected by the row select signal XS, among the plurality of word lines WL of the cell array 510, to the global word line GWL. Among the memory cells MC of the cell array 510, a memory cell connected to the bit line selected by the column select circuit 520 and connected to the word line selected by the row select circuit 530 may be a memory cell selected in order to perform a read or write operation.

The sense amplifier 560 may be connected to the global word line GWL. The sense amplifier 560 may generate an output signal DOUT by comparing the voltage level of the global word line GWL with a voltage level of a reference voltage VREF. During a read operation, the voltage level of the global word line GWL may be changed according to data stored in the selected memory cell connected to the global word line GWL. When the selected memory cell is in the high resistance state, the global word line GWL may have a lower voltage level than the reference voltage VREF, and when the selected memory cell is in the low resistance state, the global word line GWL may have a higher voltage level than the reference voltage VREF. The sense amplifier 560 may be enabled in response to the sensing enable signal SEN. Depending on when the sensing enable signal SEN is enabled, that is, depending on the length of the interval INT in FIG. 4, the threshold voltage of the selected memory cell may be increased or decreased.

In order to compensate for an increase in the threshold voltage of the memory cell MC due to a drift phenomenon, the bit line control circuit 540 may adjust the level of the read voltage VREAD according to the elapsed time information T, and the control logic 501 may adjust the interval INT according to the elapsed time information T. Table 1 below is an example of adjusting the read voltage VREAD and the interval INT according to the elapsed time information T.

TABLE 1

|  | Elapsed time | | | | | |
| --- | --- | --- | --- | --- | --- | --- |
|  | t < 0 + a | 0 + a ≤ t < 0 + b | 0 + b ≤ t < A | A ≤ t < A + a | A + a ≤ t < A + b | A + b ≤ t |
| VREAD | Low | | | High | | |
| INT | Short | Medium | Long | Short | Medium | Long |

Referring to Table 1 above, the bit line control circuit 540 may adjust the level of the read voltage VREAD differently depending on whether an elapsed time t since the write time point of the selected memory cell reaches A (for example, 10 seconds). When the elapsed time t is less than A, the bit line control circuit 540 may adjust the read voltage VREAD to a low level. For example, the read voltage VREAD may have a level in the range 301 shown in FIG. 3. When the elapsed time t is equal to or greater than A, the bit line control circuit 540 may adjust the read voltage VREAD to a high level. For example, the read voltage VREAD may have a level in the range 303 shown in FIG. 3. Through this, it is possible to compensate for an increase in the threshold voltage of the selected memory cell due to the drift phenomenon that occurs as the elapsed time t increases.

The control logic 501 may adjust the length of the interval INT according to whether the elapsed time t reaches a (for example, 2 seconds) or b (for example, 7 seconds). When the elapsed time t is less than a, the length of the interval INT may be set to be short. Since there is almost no drift in this section, no problem may occur in an operation even though the length of the interval INT is set to be short.

When the elapsed time t is equal to or greater than a and less than b, the length of the interval INT may be set to be medium. Since a drift starts to occur in this section, the length of the interval INT may be set to be medium.

When the elapsed time t is equal to or greater than b and less than A, the length of the interval INT may be set to be long. Since a drift occurs considerably in this section, the drift may be compensated for by setting the length of the interval INT to be long.

When the elapsed time t is equal to or greater than A and less than A+a, the length of the interval INT may be set to be short. In this section, a drift occurs considerably, but since the drift is compensated for by increasing the level of the read voltage VREAD, the interval INT may be set to be short.

When the elapsed time t is equal to or greater than A+a and less than A+b, the length of the interval INT may be set to be medium. Accordingly, a greater drift, compared to the drift observed in the previous section when the elapsed time t is equal to or greater than A and less than A+a, is compensated for by further adjusting the interval INT.

When the elapsed time t is equal to or greater than A+b, a drift may be further compensated for by adjusting the length of the interval INT to be longer.

Figure 6:
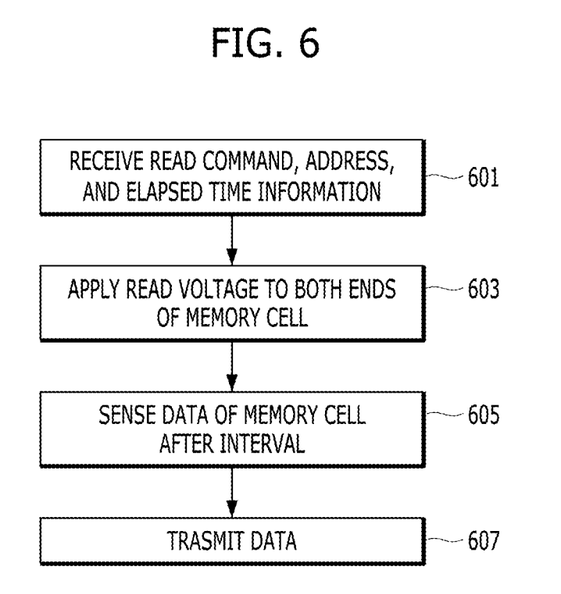
FIG. 6 illustrates a read operation of the memory in accordance with an embodiment.

FIG. 6 illustrates a read operation of the memory 500 of FIG. 5 in accordance with an embodiment.

Referring to FIGS. 5 and 6, the memory 500 may receive a read command CMD and an address ADD from the memory controller (601). The control logic 501 may decode the read command CMD to enable a read signal RD and generate elapsed time information T. Subsequently, the address decoder 503 may decode the address ADD to generate the row select signal XS and the column select signal YS for selecting a memory cell to be accessed among the memory cells of the cell array 510.

In an embodiment, the memory controller may manage a time elapsed since a write operation has been performed and inform the memory 500 of the elapsed time. In another embodiment, the memory 500 itself may manage the time elapsed since the write operation has been performed.

The read voltage VREAD may be applied across the selected memory cell among the memory cells of the cell array 510 by the operations of the line control circuit 520, 530, 540, and 550 (603). The bit line control circuit 540 may adjust the level of the read voltage VREAD according to the elapsed time information T, thereby compensating for an increase in a threshold voltage of the selected memory cell due to the drift phenomenon.

Data DOUT of the selected memory cell may be sensed after an interval INT from the application time point of the read voltage VREAD (605). The control logic 501 may adjust the length of the interval INT by adjusting a time difference between the activation time point of the sensing enable signal SEN and the activation time point of the read signal RD. The control logic 501 may compensate for the increase in the threshold voltage of the selected memory cell due to the drift phenomenon by adjusting the length of the interval INT according to the elapsed time information T. When the sensing enable signal SEN is enabled, the sense amplifier 560 may sense the data DOUT of the selected memory cell.

The data DOUT sensed by the sense amplifier 560 may be transmitted from the memory 500 to the memory controller (607), and the read operation may be terminated.

In the above-described embodiments, the drift is compensated for by adjusting the level of the read voltage VREAD and/or the length of the interval INT according to the elapsed time information T. Adjusting the level of the read voltage VREAD and adjusting the length of the interval INT according to the elapsed time information T may be independently applied. For example, only the level of the read voltage VREAD may be adjusted according to the elapsed time information T, or only the length of the interval INT may be adjusted according to the elapsed time information T.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A memory comprising:
    a cell array including a plurality of memory cells;
    a line control circuit configured to apply a read voltage to a selected memory cell among the plurality of memory cells; and
    a sense amplifier configured to determine data of the selected memory cell,
    wherein a length of an interval between a time point when the read voltage is applied to the selected memory cell and a time point when the sense amplifier is activated is adjusted according to an elapsed time since a write operation is performed on the selected memory cell.

2. The memory of claim 1, wherein the length of the interval increases as the elapsed time increases.

3. The memory of claim 1, wherein the line control circuit adjusts a level of the read voltage according to the elapsed time.

4. The memory of claim 3, wherein, when the elapsed time is less than a first time, the line control circuit adjusts the read voltage to a first level and the length of the interval is adjusted to a first value,
    when the elapsed time is equal to or greater than the first time and less than a second time, the line control circuit adjusts the read voltage to the first level and the length of the interval is adjusted to a second value that is longer than the first value, and
    when the elapsed time is equal to or greater than the second time and less than a third time, the line control circuit adjusts the read voltage to the first level and the length of the interval is adjusted to a third value that is longer than the second value.

5. The memory of claim 4, wherein, when the elapsed time is equal to or greater than the third time and less than a fourth time, the line control circuit adjusts the read voltage to a second level that is higher than the first level and the length of the interval is adjusted to the first value,
    when the elapsed time is equal to or greater than the fourth time and less than a fifth time, the line control circuit adjusts the read voltage to the second level and the length of the interval is adjusted to the second value, and
    when the elapsed time is equal to or greater than the fifth time, the line control circuit adjusts the read voltage to the second level and the length of the interval is adjusted to the third value.

6. The memory of claim 1, further comprising:
    a control logic configured to enable a read signal that instructs the line control circuit to apply the read voltage to the selected memory cell upon receiving a read command, and to enable a sensing enable signal to activate the sense amplifier after the interval.

7. The memory of claim 1, wherein the line control circuit comprises:
    a bit line control circuit configured to provide a first read boundary voltage to a global bit line in response to a read signal; and
    a word line control circuit configured to provide a second read boundary voltage to a global word line and to allow a clamping current to flow through the global word line in response to the read signal,
    wherein a voltage difference between the first read boundary voltage and the second read boundary voltage corresponds to a voltage level of the read voltage.

8. The memory of claim 7, wherein the line control circuit further comprises:
    a column select circuit configured to electrically connect a bit line selected by a column address among a plurality of bit lines to the global bit line; and
    a row select circuit configured to electrically connect a word line selected by a row address among a plurality of word lines to the global bit line,
    wherein the selected memory cell is connected to the selected bit line and the selected word line.

9. The memory of claim 1, wherein information on the elapsed time is transmitted from a memory controller to the memory.

10. An operation method of a memory, the operation method comprising:
    applying a read voltage to a memory cell; and
    determining data of the memory cell by enabling a sense amplifier after a specific interval has elapsed from a time point of applying the read voltage,
    wherein a length of the specific interval is adjusted according to an elapsed time since a write operation is performed on the memory cell.

11. The operation method of claim 10, wherein the length of the specific interval increases as the elapsed time increases.

12. The operation method of claim 10, wherein a level of the read voltage is adjusted according to the elapsed time.

13. The operation method of claim 12, wherein, when the elapsed time is less than a first time, the read voltage is adjusted to a first level and the length of the specific interval is adjusted to a first value,
    when the elapsed time is equal to or greater than the first time and less than a second time, the read voltage is adjusted to the first level and the length of the specific interval is adjusted to a second value that is longer than the first value, and
    when the elapsed time is equal to or greater than the second time and less than a third time, the read voltage is adjusted to the first level and the length of the specific interval is adjusted to a third value that is longer than the second value.

14. The operation method of claim 13, wherein, when the elapsed time is equal to or greater than the third time and less than a fourth time, the read voltage is adjusted to a second level that is higher than the first level and the length of the specific interval is adjusted to the first value,
    when the elapsed time is equal to or greater than the fourth time and less than a fifth time, the read voltage is adjusted to the second level and the length of the specific interval is adjusted to the second value, and
    when the elapsed time is equal to or greater than the fifth time, the read voltage is adjusted to the second level and the length of the specific interval is adjusted to the third value.

15. The operation method of claim 10, further comprising:
   before the applying of the read voltage, receiving, from a memory controller, a read command instructing a read operation, an address for selecting the memory cell, and information on the elapsed time.

* * * * *